(12) United States Patent
You

(10) Patent No.: US 12,713,789 B2
(45) Date of Patent: Aug. 18, 2026

(54) DISPLAY DEVICE HAVING PROTRUSION AND PADS

(71) Applicant: SAMSUNG DISPLAY CO., LTD., Yongin-si (KR)

(72) Inventor: Chungi You, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 448 days.

(21) Appl. No.: 18/213,343

(22) Filed: Jun. 23, 2023

(65) Prior Publication Data

US 2024/0065051 A1 Feb. 22, 2024

(30) Foreign Application Priority Data

Aug. 18, 2022 (KR) ........................ 10-2022-0103343

(51) Int. Cl.
*H10K 59/131* (2023.01)
*H10K 59/122* (2023.01)

(52) U.S. Cl.
CPC ......... *H10K 59/131* (2023.02); *H10K 59/122* (2023.02)

(58) Field of Classification Search
None
See application file for complete search history.

(56) References Cited

U.S. PATENT DOCUMENTS 11,424,312 B2 8/2022 Baek et al.
2012/0074408 A1* 3/2012 Moon ................ H10K 59/1213 438/34
2018/0269269 A1 9/2018 Kim et al.
2019/0163304 A1* 5/2019 Shim .................... G09G 3/3233
2021/0091161 A1* 3/2021 Baek .................... H10K 59/873
2022/0059640 A1 2/2022 Park et al.
2022/0139970 A1 5/2022 Kim et al.
2022/0181427 A1 6/2022 Yang et al.
2022/0278088 A1 9/2022 Park et al.

FOREIGN PATENT DOCUMENTS

KR 20180105551 A 9/2018
KR 102082784 B1 3/2020
KR 1020200077016 A 6/2020
KR 1020210008277 A 1/2021
KR 1020210035358 A 4/2021
KR 20210059531 A 5/2021
KR 1020220023893 3/2022
KR 20220060019 A 5/2022
KR 20220082153 A 6/2022

* cited by examiner

*Primary Examiner* — Sue A Purvis
*Assistant Examiner* — Seyon Ali-Simah Punchbeddell
(74) *Attorney, Agent, or Firm* — CANTOR COLBURN LLP

(57) ABSTRACT

A display device includes: a substrate including a display area and a peripheral area outside the display area; a pixel electrode disposed on the substrate and located in the display area; a pixel-defining layer covering an edge of the pixel electrode; a plurality of first pads disposed on the substrate and located in the peripheral area; and a protrusion, which is disposed on the substrate and located in the peripheral area, has a height, from an upper surface of the substrate, that is greater than a height from the upper surface of the substrate to an upper surface of the plurality of first pads, and comprises a first layer having a same layered structure as the pixel-defining layer.

19 Claims, 11 Drawing Sheets h3
105
120
104
103
102
101
100
A
110
111
113
107
112
130
150
140
106
108
DA
220
200
210
230
h2
PA
B
401
402
400
307
306
305
300
h1

DISPLAY DEVICE HAVING PROTRUSION AND PADS

This application claims priority to Korean Patent Application No. 10-2022-0103343, filed on Aug. 18, 2022, and all the benefits accruing therefrom under 35 U.S.C. § 119, the content of which in its entirety is herein incorporated by reference.

BACKGROUND

1. Field

One or more embodiments relate to a display device. More particularly, one or more embodiments relate to a display device in which a plurality of pads may be protected from a mask frame used in a manufacturing process of the display device.

2. Description of the Related Art

A display device is configured to display images by receiving information about the images. A display panel included in such a display device includes at an edge thereof pads electrically connected to display elements to receive information about an image or the like, and the pads are electrically connected to pads of a printed circuit board or bumps of an electronic chip.

As the display device having thin bezels has become widely used, an area of a non-display area in the display device has been reduced. Accordingly, when the display device is manufactured, the pads may be damaged by a frame of a mask-frame assembly in a process of using the mask-frame assembly during a deposition process.

SUMMARY

One or more embodiments include a display device in which a plurality of pads may be protected from a mask-frame assembly used in a manufacturing process of the display device. However, the one or more embodiments are only examples, and the scope of the disclosure is not limited thereto.

Additional aspects will be set forth in part in the description that follows and, in part, will be apparent from the description, or may be learned by practice of the embodiments of the disclosure.

According to an embodiment, a display device includes: a substrate including a display area and a peripheral area outside the display area; a pixel electrode disposed on the substrate and located in the display area; a pixel-defining layer covering an edge of the pixel electrode; a plurality of first pads disposed on the substrate and located in the peripheral area; and a protrusion, which is disposed on the substrate and located in the peripheral area, has a height, from an upper surface of the substrate, that is greater than a height from the upper surface of the substrate to an upper surface of the plurality of first pads, and comprises a first layer having the same layered structure as the pixel-defining layer.

The display device may further include a plurality of insulating layers between the substrate and the pixel electrode, where the protrusion further includes second layers located between the substrate and the first layer and corresponding to the plurality of insulating layers.

The display device may further include a plurality of conductive layers between the substrate and the pixel electrode, where the plurality of first pads may include sub-pads corresponding to the plurality of conductive layers.

The plurality of first pads may further include an additional pad located on the sub-pads and including the same material as the pixel electrode.

The first layer may be integrally provided as a single body with the pixel-defining layer.

The display device may further include a plurality of second pads which is disposed on the substrate and located in the peripheral area, and is located on a more outer portion of the substrate than the plurality of first pads with respect to a center of the display area.

The plurality of first pads may be disposed opposing the plurality of second pads with respect to the protrusion.

The plurality of first pads may be disposed in a first direction from the plurality of second pads, and the plurality of first pads may include: a plurality of $1^{st}$-$1^{st}$ pads arranged in a second direction crossing the first direction, and a plurality of $1^{st}$-$2^{nd}$ pads located and spaced apart in the first direction from the $1^{st}$-$1^{St}$ pads and arranged in the second direction.

The $1^{st}$-$1^{st}$ pads may be disposed opposing the $1^{st}$-$2^{nd}$ pads with respect to the protrusion.

The first layer may be integrally provided as a single body with the pixel-defining layer.

A distance between the plurality of $1^{st}$-$1^{st}$ pads and the plurality of $1^{st}$-$2^{nd}$ pads in the first direction may be less than a distance between the plurality of $1^{st}$-$2^{nd}$ pads and the plurality of second pads in the first direction.

The second layers may include: a first sub-layer located between the substrate and the first layer and corresponding to a first insulating layer, and a second sub-layer located between the first sub-layer and the first layer and corresponding to a second insulating layer, and the plurality of insulating layers may include the first insulating layer and the second insulating layer.

At least one of the first sub-layer and the second sub-layer may cover part of at least one of the plurality of first pads.

The at least one of the plurality of first pads may include a first sub-pad located on the substrate, a second sub-pad located on the first sub-pad, and a third sub-pad located on the second sub-pad, and the first sub-layer may cover part of an upper surface of the first sub-pad, and the second sub-layer is spaced apart from the plurality of second pads.

The first insulating layer may cover another part of the upper surface of the first sub-pad, and the second insulating layer may be apart from the plurality of first pads.

The at least one of the plurality of first pads may include a first sub-pad located on the substrate, a second sub-pad located on the first sub-pad, and a third sub-pad located on the second sub-pad, and the first sub-layer may be apart from the plurality of first pads, and the second sub-layer may cover the first sub-layer and at least part of one sidewall of the second sub-pad.

The first insulating layer may be apart from the plurality of first pads, and the second insulating layer may cover the first insulating layer and at least part of another sidewall of the second sub-pad.

The at least one of the plurality of first pads may include a first sub-pad located on the substrate, a second sub-pad located on the first sub-pad, and a third sub-pad located on the second sub-pad, and the first sub-layer may cover part of an upper surface of the first sub-pad, and the second sub-layer may cover the first sub-layer and at least part of a sidewall of the second sub-pad.

The first insulating layer may cover another part of the upper surface of the first sub-pad, and the second insulating layer may cover the first insulating layer and at least part of another sidewall of the second sub-pad.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a plan view schematically illustrating a plurality of pads of the display device according to an embodiment;

FIG. 7 is a plan view schematically illustrating a plurality of pads of the display device according to another embodiment;

FIG. 8 is a plan view schematically illustrating a plurality of pads of the display device according to still another embodiment;

DETAILED DESCRIPTION

Figure 1:
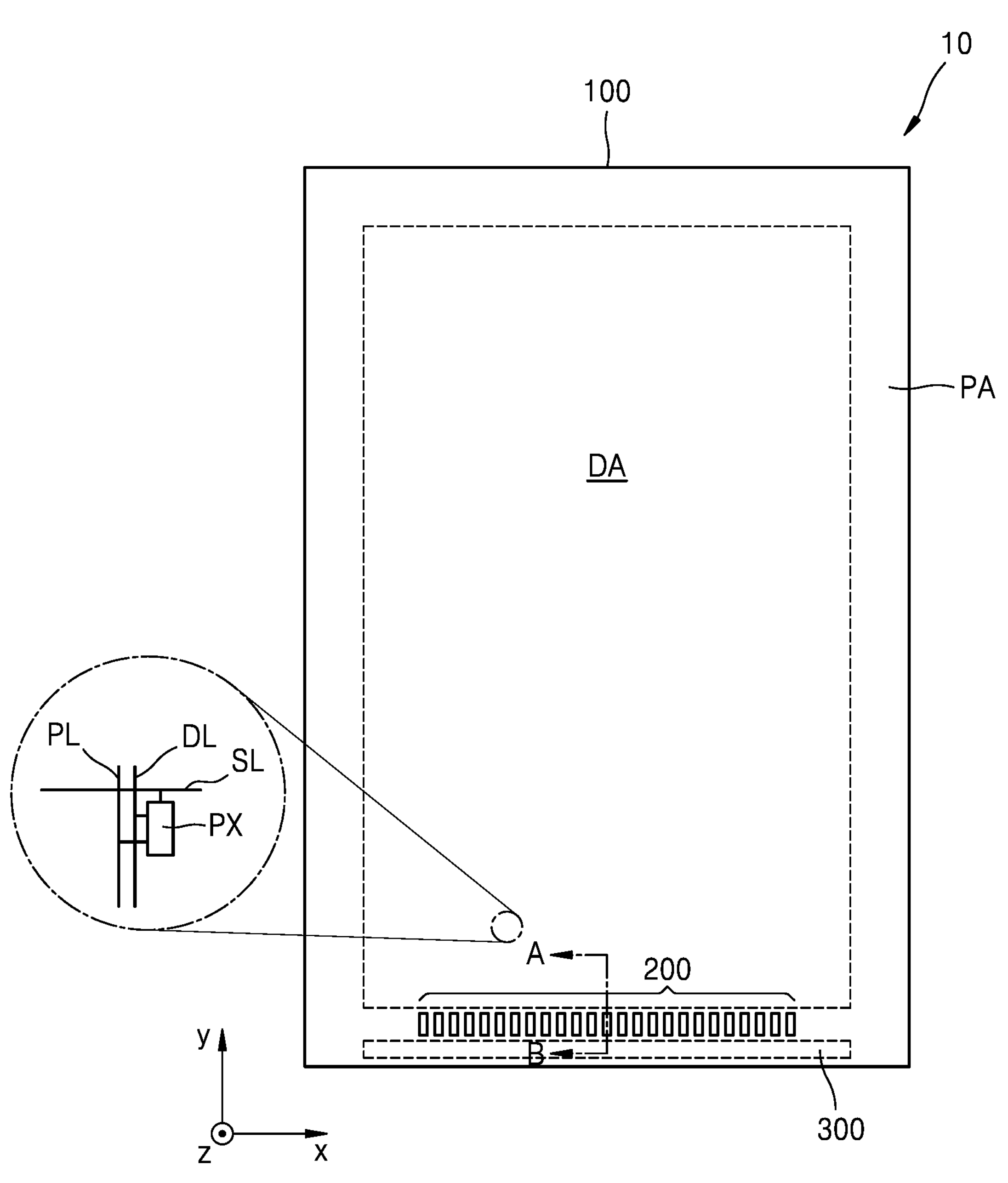
FIG. 1 is a plan view schematically illustrating a display device according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments will be described below in more detail with reference to the accompanying drawings. Those elements that are the same or are in correspondence are rendered the same reference numeral regardless of the figure number, and redundant descriptions thereof are omitted.

It will be understood that when an element, such as a layer, a film, a region, or a plate, is referred to as being "on" another element, the element can be directly on the other element or intervening elements may be present therebetween. Sizes of elements in the drawings may be exaggerated or reduced for convenience of description. In other words, since sizes and thicknesses of elements in the drawings are arbitrarily illustrated for convenience of explanation, the following embodiments are not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, a display device according to an embodiment of the disclosure is described in detail based on the descriptions above.

Figure 2:
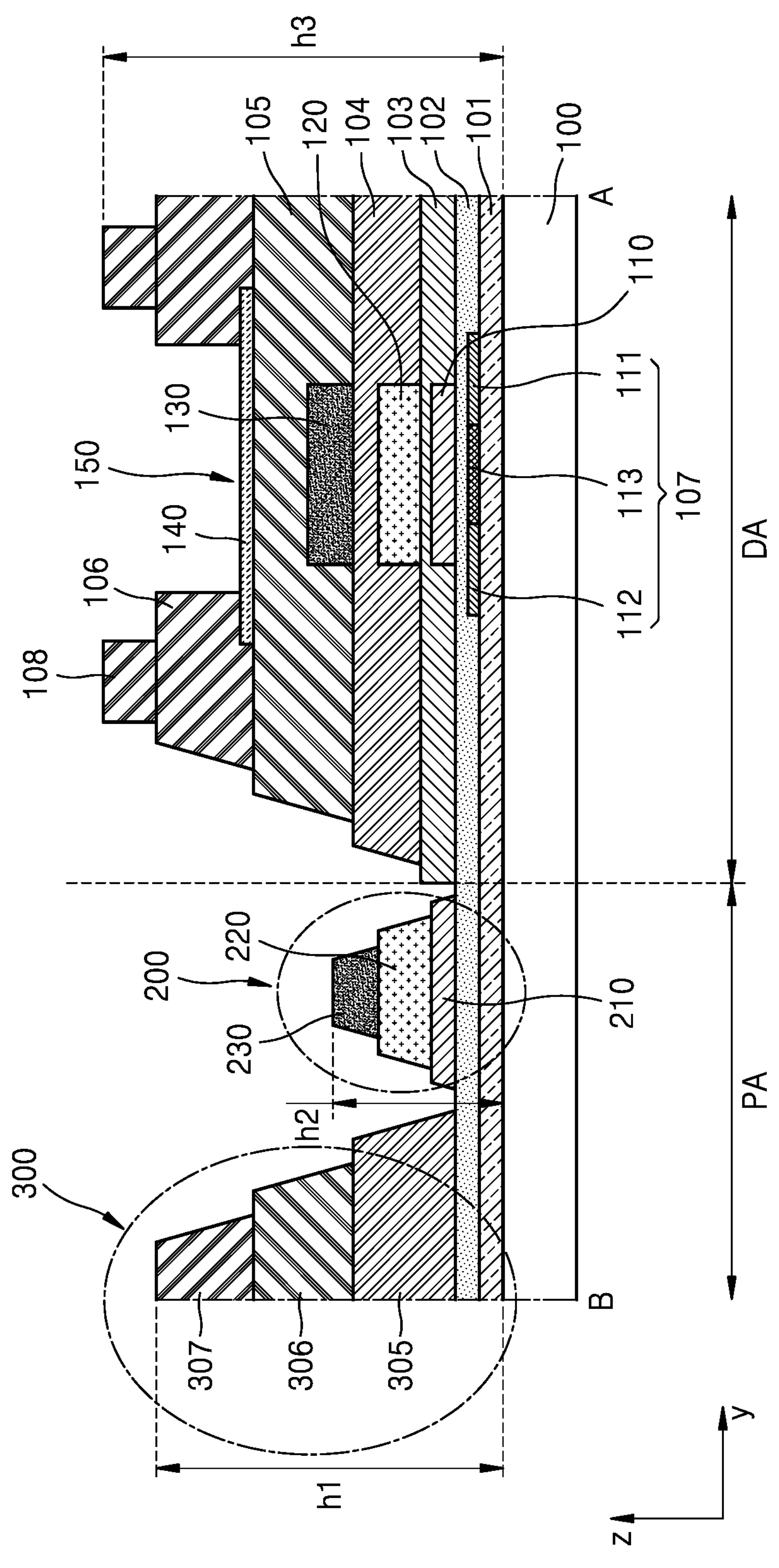
FIG. 2 is a cross-sectional view schematically illustrating a cross-section of the display device, taken along line A-B in FIG. 1.

FIG. 1 is a plan view schematically illustrating a display device according to an embodiment, and FIG. 2 is a cross-sectional view schematically illustrating a cross-section of the display device, taken along line A-B in FIG. 1. As used herein, the "plan view" is a view in z direction (i.e., thickness direction of the display device).

As shown in FIG. 1, a display panel 10 included in the display device according to an embodiment may include a plurality of first pads 200 and a protrusion 300. The display device may be any display device that includes the display panel 10. For example, the display device may include various devices, such as smartphones, tablets, laptops, televisions, or advertisement boards. The display device according to an embodiment may include thin-film transistors and a capacitor, and the thin-film transistors and the capacitor may be implemented by conductive layers and insulating layers.

The display panel 10 may include a display area DA and a peripheral area PA located outside the display area DA. In FIG. 1, the display area DA has a rectangular shape. However, the disclosure is not limited thereto. The display area DA may have various shapes, such as a circle, an ellipse, a polygon, or a particular figure.

The display area DA is a portion on which an image is displayed, and a plurality of pixels PX may be arranged in the display area DA. Each of the pixels PX may include a display element, such as an organic light-emitting diode. For example, each of the pixels PX may emit red, green, or blue light. The pixel PX may be connected to a pixel circuit including a thin-film transistor, a storage capacitor, or the like. The pixel circuit may be connected to a scan line SL configured to transmit a scan signal, a data line DL crossing the scan line SL and configured to transmit a data signal, and a driving voltage line PL configured to apply a driving voltage. The scan line SL may extend in an x direction, and each of the data line DL and the driving voltage line PL may extend in a y direction.

The pixel PX may emit light of a luminance corresponding to an electrical signal from the pixel circuit electrically connected thereto. The display area DA may display an image through light emitted from the pixel PX. The term "pixel PX" as used herein may be defined as an emission area for emitting any of red, green, and blue light, as described above.

The peripheral area PA, which is an area in which the pixel PX is not arranged, may be an area in which an image is not displayed. A power supply line configured to drive the pixel PX or the like may be located in the peripheral area PA. In addition, in the peripheral area PA, the plurality of first pads 200 are arranged such that a printed circuit board including a driving circuit unit, or an integrated circuit device, such as a driver integrated circuit ("IC"), is electrically connected to the plurality of first pads 200. In addition, the protrusion 300 to be described below may also be located in the peripheral area PA.

Because the display panel 10 includes a substrate 100, it may be described that the substrate 100 includes the display area DA and the peripheral area PA.

In addition, a plurality of transistors may be arranged in the display area DA. In the plurality of transistors, a first terminal may be one of a source electrode and drain electrode, and a second terminal may be the other one of the source electrode and the drain electrode, depending on a type (N-type or P-type) and/or operating conditions of the transistor. For example, when the first terminal is a source electrode, the second terminal may be a drain electrode.

The plurality of transistors may include a driving transistor, a data write transistor, a compensation transistor, an initialization transistor, an emission control transistor, or the like. The driving transistor may be connected between a driving voltage line PL and an organic light-emitting element, and the data write transistor may be connected to the data line DL and the driving transistor and perform a switching operation for transmitting a data signal received via the data line DL.

The compensation transistor may be turned on in response to a scan signal received via the scan line SL and connect the driving transistor to the organic light-emitting element and compensate for a threshold voltage of the driving transistor.

The initialization transistor may be turned on in response to a scan signal received via the scan line SL and transfer an initialization voltage to a gate electrode of the driving transistor and initialize the gate electrode of the driving transistor. The scan line connected to the initialization transistor may be an additional scan line that is different from the scan line connected to the compensation transistor.

The emission control transistor may be turned on in response to an emission control signal received via an emission control line, and as a result, a driving current may flow through the organic light-emitting element.

The organic light-emitting element may include a pixel electrode (a first electrode; an anode) and an opposite electrode (a second electrode; a cathode), and the opposite electrode may receive a common voltage. The organic light-emitting element may receive a driving current from the driving transistor and emit light, so that an image may be displayed.

Hereinafter, an organic light-emitting display is described as an example of the display device according to an embodiment. However, the display device of the disclosure is not limited thereto. In another embodiment, the display device of the disclosure may include an inorganic light-emitting display (or an inorganic electroluminescent ("EL") display) and a quantum dot light-emitting display. For example, an emission layer of a display element included in the display device may include an organic material or an inorganic material. In addition, the display device may include an emission layer and quantum dots on a path of light emitted from the emission layer.

As described above, in the display device according to the present embodiment, the plurality of first pads 200 may be arranged in the peripheral area PA of the substrate 100.

The plurality of first pads 200 may be exposed by not being covered by an insulating layer, and electrically connected to a flexible printed circuit board or a driving IC chip, as described above. An image data signal from the flexible printed circuit board or the like may be transferred to the display area DA via the plurality of first pads 200. The plurality of first pads 200 may be connected to a plurality of fan-out wirings (not shown) and transfer a voltage or various signals to the display area DA.

As shown in FIG. 1, the display device according to the present embodiment may include the protrusion 300 on the peripheral area PA of the substrate 100. The protrusion 300 may be located around the plurality of first pads 200. As shown in FIG. 2, a height h1 of the protrusion 300 (e.g., height from an upper surface of the substrate 100 in z direction) may be greater than a height h2 of the plurality of first pads 200 in the thickness direction (i.e., z direction). The protrusion 300 may be located around the plurality of first pads 200 and protect the plurality of first pads 200.

As shown in FIG. 2, the display device according to the present embodiment may include the substrate 100, and pixel electrodes 140 and a pixel-defining layer 106 may be disposed on the substrate 100. In addition, the plurality of first pads 200 and the protrusion 300 described above may also be disposed on the substrate 100. In addition, the display device according to the present embodiment may include a buffer layer 101, a semiconductor layer 107, a gate insulating film 102, a gate layer 110, an interlayer-insulating film 103, a first conductive layer 120, a first insulating layer 104, a second conductive layer 130, a second insulating layer 105, and a spacer 108.

The substrate 100 may include areas corresponding to the display area DA and the peripheral area PA located outside the display area DA. The substrate 100 may include various materials that are flexible or bendable. For example, the substrate 100 may include glass, metal, or polymer resin.

The buffer layer 101 may be located on the substrate 100. The buffer layer 101 may prevent impurity ions from being diffused, prevent permeation of moisture or ambient air, and serve as a barrier layer for planarizing a surface, and/or as a blocking layer. The buffer layer 101 may include silicon oxide, silicon nitride, or silicon oxynitride. In addition, the buffer layer 101 may adjust a speed in which heat is provided during a crystallization process for forming the semiconductor layer 107, so that the semiconductor layer 107 is uniformly crystallized.

The semiconductor layer 107 may be located on the buffer layer 101. The semiconductor layer 107 may include polysilicon, and may include a channel area 113 and a source area 111 and a drain area 112 at opposite sides of the channel area 113, where the channel area 113 is not doped with impurities, and the source area 111 and the drain area 112 are doped with impurities. Here, the impurities may vary depending on the type of the thin-film transistor, and may be N-type impurities or P-type impurities.

The gate insulating film 102 may be located on the semiconductor layer 107. The gate insulating film 102 may be an element for ensuring insulation between the semiconductor layer 107 and the gate layer 110. The gate insulating film 102 may include an inorganic material, such as silicon oxide, silicon nitride, and/or silicon oxynitride, and may be located between the semiconductor layer 107 and the gate layer 110. In addition, the gate insulating film 102 may have a shape corresponding to an entire surface of the substrate 100, and may have a structure in which contact holes are defined in preset portions. As described above, the insulating film including the inorganic material may be formed by chemical vapor deposition ("CVD") or atomic layer deposition ("ALD"). This may be true for embodiments to be described below and modifications thereof.

The gate layer 110 may be located on the gate insulating film 102. The gate layer 110 may be arranged at a location vertically overlapping the semiconductor layer, and may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), titanium (Ti), tungsten (W), and copper (Cu).

The interlayer-insulating film 103 may be located on the gate layer 110. The interlayer-insulating film 103 may cover the gate layer 110. The interlayer-insulating film 103 may include an inorganic material. For example, the interlayer-insulating film 103 may include a metal oxide or metal nitride, and for example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In some cases, the interlayer-insulating film 103 may include a dual structure of $SiO_x/SiN_y$ or $SiN_x/SiO_y$.

The first conductive layer 120 may be located on the interlayer-insulating film 103. The first conductive layer 120 may serve as another gate layer. In some cases, the first conductive layer 120 may overlap the gate layer 110 with the interlayer-insulating film 103 therebetween, and may function as a capacitor for driving a display.

The first conductive layer 120 may include at least one metal selected from among Al, Pt, Pd, Ag, Mg, Au, Ni, Nd, Ir, Cr, Li, Ca, Mo, Ti, W, and Cu. For example, the first conductive layer 120 may include a Ti layer, an Al layer, and/or a Cu layer.

The first insulating layer 104 may be located on the first conductive layer 120. The first insulating layer 104 may have an approximately flat upper surface by covering an upper portion of the first conductive layer 120, and may be an organic insulating layer serving as a planarization film. For example, the first insulating layer 104 may include an organic material, such as acrylic, benzocyclobutene ("BCB"), or hexamethyldisiloxane ("HMDSO"). The first insulating layer 104 may include a layer or layers, and various modifications may be made.

The second conductive layer 130 may be located on the first insulating layer 104. In addition, the second conductive layer 130 may serve as a wiring layer for transferring data or power. The second conductive layer 130 may include the same layered structure as the first conductive layer 120. The second conductive layer 130 may include at least one metal selected from among Al, Pt, Pd, Ag, Mg, Au, Ni, Nd, Ir, Cr, Li, Ca, Mo, Ti, W, and Cu. For example, the second conductive layer 130 may include a Ti layer, an Al layer, and/or a Cu layer. As used herein, when two layers has the "same layered structure" as each other, it may mean that the two layers are formed of the same material as each other.

The second insulating layer 105 may be located on the second conductive layer 130. The second insulating layer 105 may include the same layered structure as the first insulating layer 104. The second insulating layer 105 may have an approximately flat upper surface by covering an upper portion of the second conductive layer 130, and may be an organic insulating layer serving as a planarization film. For example, the second insulating layer 105 may include an organic material, such as acrylic, BCB, or HMDSO. The second insulating layer 105 may include a layer or layers, and various modifications may be made.

The pixel electrode 140 may be located on the second insulating layer 105. The pixel electrode 140 may be connected to the first conductive layer 120 or second conductive layer 130 through a contact hole defined in the second insulating layer 105. A display element may be located on the pixel electrode 140. The organic light-emitting element may be used as the display element. In other words, the organic light-emitting element may be located, for example, on the pixel electrode 140.

The electrode 140 may be disposed on the substrate 100. In other words, the electrode 140 may be disposed on the substrate 100 and located in the display area. The pixel electrode 140 may include a transmissive conductive layer including a transmissive conductive oxide, such as indium tin oxide ("ITO"), indium oxide ($In_2O_3$), or indium zinc oxide ("IZO"), and a reflective layer including a metal, such as Al or Ag. For example, the pixel electrode 140 may have a three-layer structure consisting of an ITO layer, an Ag layer, and another ITO layer.

The pixel-defining layer 106 may be located over the second insulating layer 105 and may be arranged to cover an edge of the pixel electrode 140. In other words, the pixel-defining layer 106 may cover an edge of the electrode 140. The pixel-defining layer 106 may include an opening 150 corresponding to each pixel, and the opening 150 may be formed to expose at least a central portion of the pixel electrode 140.

The pixel-defining layer 106 may include an organic material, such as polyimide or HMDSO. In addition, the spacer 108 may be disposed on the pixel-defining layer 106.

Although not shown in FIG. 2, an intermediate layer (not shown) and an opposite electrode (not shown) may be located on the opening. The intermediate layer (not shown) may include a low-molecular weight material or a polymer material, and when the intermediate layer includes the low-molecular weight material, the intermediate layer (not shown) may include a hole injection layer ("HIL"), a hole transport layer ("HTL"), an emission layer ("EML"), an electron transport layer ("ETL"), and/or an electron injection layer ("EIL"). When the intermediate layer (not shown) includes the polymer material, the intermediate layer (not shown) may generally have a structure including the HTL and the EML. The opposite electrode (not shown) may include a transmissive conductive layer including a transmissive conductive oxide, such as ITO, $In_2O_3$, or IZO.

As shown in FIGS. 1 and 2, the plurality of first pads 200 may be disposed on the substrate 100 and located in the peripheral area PA of the display device. The plurality of first pads 200 may have a multi-layer structure, and the multi-layer structure of the plurality of first pads 200 may include the same layered structure as at least one layer from among the gate layer 110, the first conductive layer 120, and the second conductive layer 130 described above.

As shown in FIG. 2, The plurality of first pads 200 may include sub-pads 210, 220, and 230 corresponding to the plurality of conductive layers (e.g., the gate layer 110, the first conductive layer 120, and the second conductive layer 130) included in the display device. In other words, the plurality of first pads 200 may have a multi-layer structure including the sub-pads 210, 220, and 230.

The plurality of first pads 200 may include a first sub-pad 210 located on the substrate 100 and having the same layered structure as the gate layer 110, a second sub-pad 220 located on the first sub-pad 210 and having the same layered structure as the first conductive layer 120, and a third sub-pad 230 located on the second sub-pad 220 and having the same layered structure as the second conductive layer 130. In addition, the plurality of first pads 200 may include at least one sub-pad from among the first sub-pad 210 to the third sub-pad 230.

An area of an upper surface of the first sub-pad 210 may be greater than an area of an upper surface of the second sub-pad 220, and the area of the upper surface of the second sub-pad 220 may be greater than an area of an upper surface of the third sub-pad 230.

The upper surface of the first sub-pad 210 may be in contact with a lower surface of the second sub-pad 220, and the upper surface of the second sub-pad 220 may be in contact with a lower surface of the third sub-pad 230, so that the first sub-pad 210 to the third sub-pad 230 may be electrically connected to one another.

The first sub-pad 210 may be simultaneously formed of the same material as a material of the gate layer 110 in a process in which the gate layer 110 is formed, the second sub-pad 220 may be simultaneously formed of the same material as a material of the first conductive layer 120 in a process in which the first conductive layer 120 is formed, and the third sub-pad 230 may be simultaneously formed of the same material as a material of the second conductive layer 130 in a process in which the second conductive layer 130 is formed. In this case, the first sub-pad 210 may have the same layered structure as the gate layer 110, the second sub-pad 220 may have the same layered structure as the first conductive layer 120, and the third sub-pad 230 may have the same layered structure as the second conductive layer 130.

As shown in FIG. 2, the protrusion 300 may be disposed on the substrate 100 and located in the peripheral area PA of the display device. The protrusion 300 may be at the first height h1 from an upper surface of the substrate 100 to an upper surface of the protrusion 300. In addition, the plurality of first pads 200 may be at the second height h2 from the upper surface of the substrate 100 to an upper surface of the plurality of first pads 200. In this case, the first height h1 may be greater than the second height h2.

As shown in FIG. 2, a third height h3, from the upper surface of the substrate 100 to an upper surface of the spacer 108 located on the pixel-defining layer 106, may be greater than the second height h2. The spacer 108 may prevent a mask (See mask 401 in FIG. 3) from coming in contact with the pixel-defining layer 106 or the like in a deposition process.

As shown in FIG. 2, the protrusion 300 may include a multi-layer structure. For example, as shown in FIG. 2, the protrusion 300 may include a first layer 307 and second layers 305 and 306. In this case, the first layer 307 of the protrusion 300 may have the same layered structure as the pixel-defining layer 106. Therefore, when first layer 307 and the pixel-defining layer 106 may be formed of the same material as each other.

The second layers 305 and 306 of the protrusion 300 may correspond to the plurality of insulating layers 104 and 105, which are located between the substrate 100 and the pixel electrodes 140. The second layers 305 and 306 may be located between the substrate 100 and the first layer 307.

The second layers 305 and 306 may include a first sub-layer 305. The first sub-layer 305 may be located between the substrate 100 and the first layer 307. The first sub-layer 305 may correspond to the first insulating layer 104 located between the substrate 100 and the pixel electrodes 140. When the first sub-layer 305 corresponds to the first insulating layer 104, it may denote that the first sub-layer 305 and the first insulating layer 104 are simultaneously formed of the same material as each other in a manufacturing process. In addition, the second layers 305 and 306 may further include a second sub-layer 306. The second sub-layer 306 may be located between the first sub-layer 305 and the first layer 307 and may correspond to the second insulating layer 105. When the second sub-layer 306 corresponds to the second insulating layer 105, it may denote that the second sub-layer 306 and the second insulating layer 105 are simultaneously formed of the same material as each other in a manufacturing process.

An upper surface of the first sub-layer 305 may be in contact with a lower surface of the second sub-layer 306, and an upper surface of the second sub-layer 306 may be in contact with a lower surface of the first layer 307. An area of the upper surface of the first sub-layer 305 may be greater than an area of the upper surface of the second sub-layer 306, and the area of the upper surface of the second sub-layer 306 may be greater than the area of an upper surface of the first layer 307. As described above, the protrusion 300 may include the first layer 307 and the second layers 305 and 306, and may have a step structure in which an area of an upper surface decreases toward an upper layer structure. Due to this step structure, the protrusion 300 may have structural stability. In other words, even when a mask-frame assembly 400 is in contact with the protrusion 300, the protrusion 300 having the step structure may be sufficient to support the mask-frame assembly 400.

Figure 3:
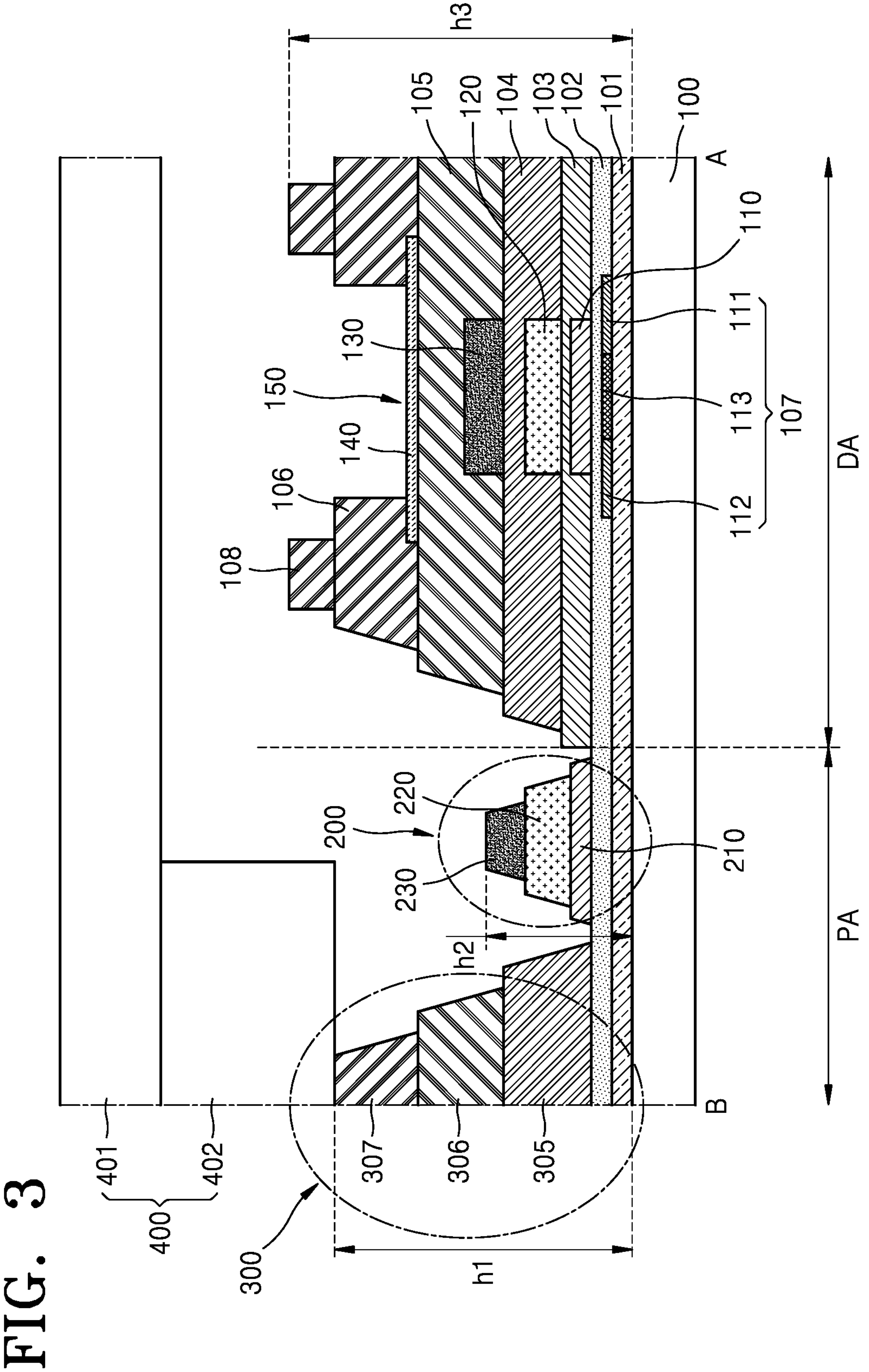
FIG. 3 is a cross-sectional view schematically illustrating, in the cross-section of FIG. 2, an example in which a mask-frame assembly is used in a manufacturing process of the display device.

FIG. 3 is a cross-sectional view schematically illustrating, in the cross-section of FIG. 2, an example in which the mask-frame assembly 400 is used in a manufacturing process of the display device.

As shown in FIG. 3, a mask 401 may be mounted on a frame 402 and form the mask-frame assembly 400. The mask-frame assembly 400 may be located in the peripheral area PA of the display device, and when the protrusion 300 is not present, the frame 402 of the mask-frame assembly 400 may be in contact with the plurality of first pads 200.

Because the first height h1 of the protrusion 300 of the display device according to the present embodiment is greater than the second height h2 of the plurality of first pads 200, a lower surface of the frame 402 may be supported by the upper surface of the protrusion 300, and the lower surface of the frame 402 may be apart from the upper surface of the plurality of first pads 200. As a result, the plurality of first pads 200 may be protected from the mask-frame assembly 400 even when the mask-frame assembly 400 is located in the peripheral area PA of the display device.

Figure 4:
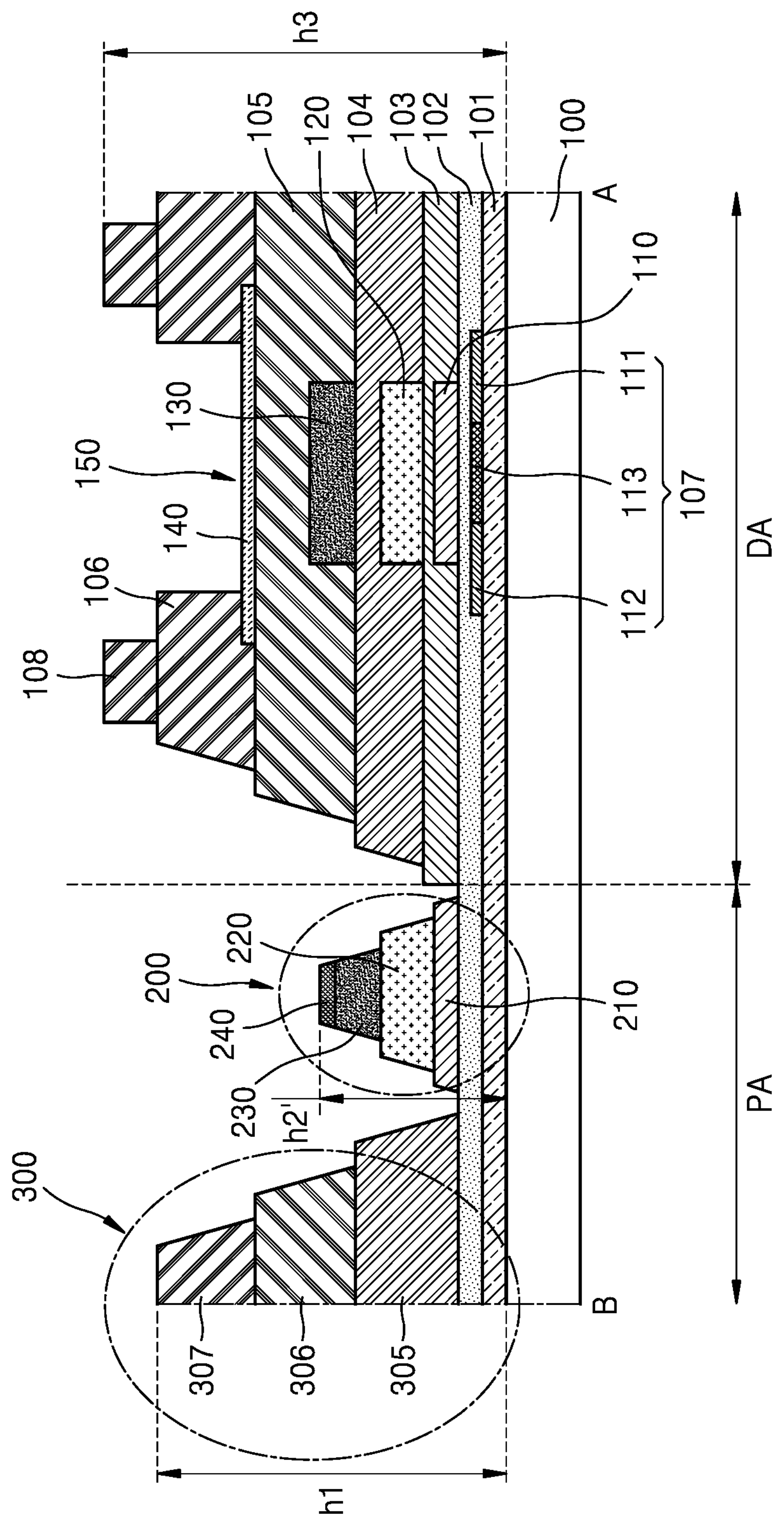
FIG. 4 is a cross-sectional view schematically illustrating part of the display device according to an embodiment.

FIG. 4 is a cross-sectional view schematically illustrating part of the display device according to an embodiment.

The plurality of first pads 200 may have various structures. For example, as shown in FIG. 4, in which part of the display device according to an embodiment is schematically shown, the plurality of first pads 200 may further include an additional pad 240 including the same material as a material of the pixel electrode 140. The additional pad 240 may perform a function of preventing oxidation or corrosion of the first sub-pad 210 to the third sub-pad 230. In other words, the additional pad 240 may have the same layered structure as the pixel electrode 140. The additional pad 240 may be simultaneously formed of the same material as a material of the pixel electrode 140 in a process in which the pixel electrode 140 is formed.

In addition, the area of the upper surface of the first sub-pad 210 is greater than the area of the upper surface of the second sub-pad 220, and the area of the upper surface of the second sub-pad 220 may be greater than the area of the upper surface of the third sub-pad 230. In addition, the area of the upper surface of the third sub-pad 230 may be greater than an area of an upper surface of the additional pad 240. Due to this step structure, the plurality of first pads 200 may have structural stability. In other words, even when a flexible printed circuit board or a driving driver IC chip is connected to the plurality of first pads 200, the plurality of first pads 200 may stably maintain a shape thereof.

The upper surface of the first sub-pad 210 may be in contact with the lower surface of the second sub-pad 220, the upper surface of the second sub-pad 220 may be in contact with the lower surface of the third sub-pad 230, and the upper surface of the third sub-pad 230 may be in contact with a lower surface of the additional pad 240, so that the first sub-pad 210 to the third sub-pad 230 and the additional pad 240 may be electrically connected to one another.

The plurality of first pads 200 may be at a second height h2', which is from the upper surface of the substrate 100 to the upper surface of the plurality of first pads 200. In other words, the first height h1 may be greater than the second height h2', and the third height h3 may be greater than the second height h2'.

Figure 5:
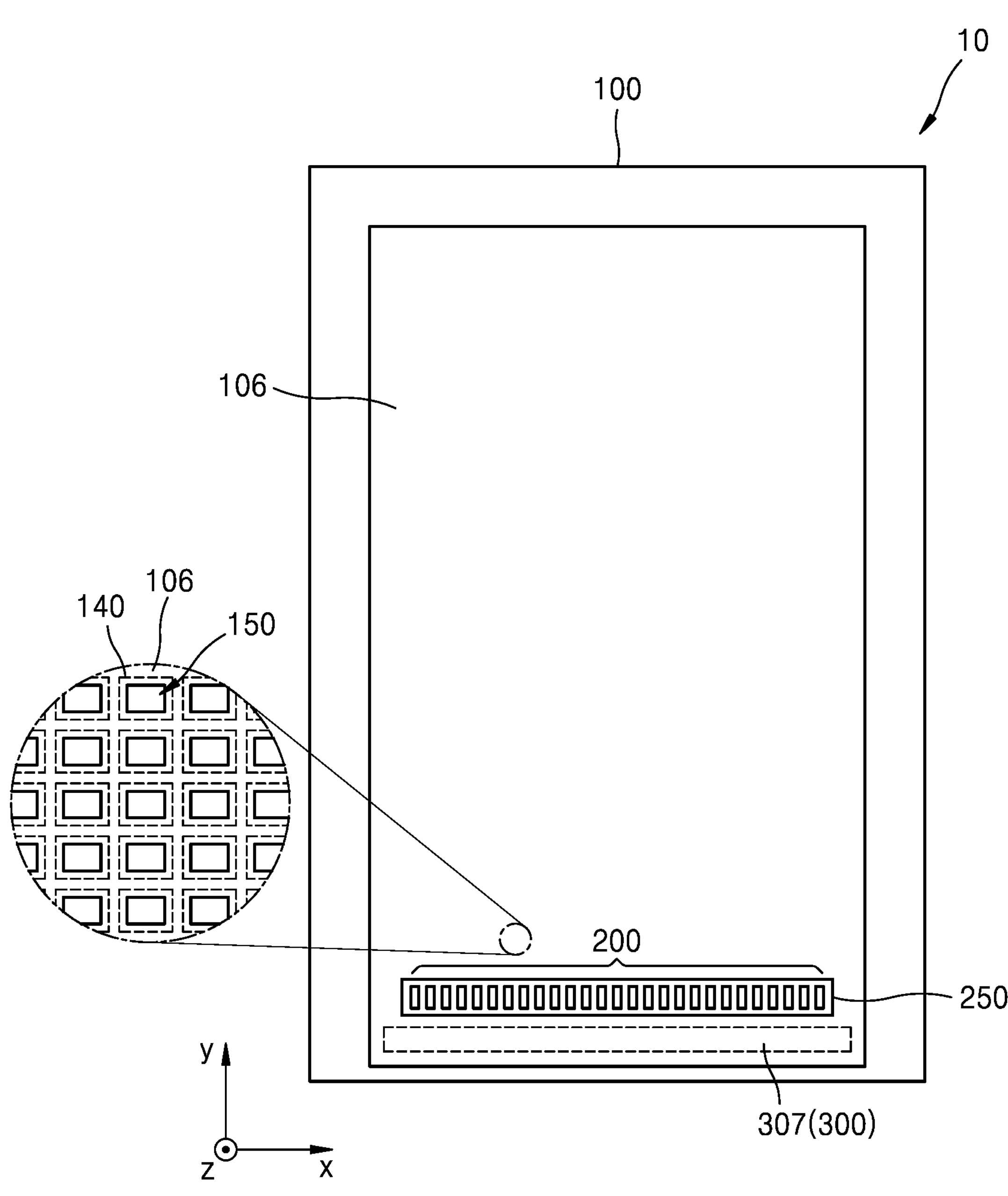
FIG. 5 is a plan view schematically illustrating the display device according to an embodiment.

FIG. 5 is a plan view schematically illustrating the display device according to an embodiment.

As shown in FIG. 5, the display device according to the present embodiment may include the pixel electrodes 140 and the pixel-defining layer 106 covering edges of the pixel electrodes 140. In this case, the pixel-defining layer 106 may be located on the pixel electrodes 140 and define the openings 150 therein corresponding to the pixel electrodes 140, respectively, and the opening 150 may expose at least the central portion of the pixel electrode 140.

The plurality of first pads 200 may be electrically connected to an external circuit or the like. Accordingly, the pixel-defining layer 106 may further define a second opening 250 therein and expose first pads 200 through the second opening 250. The second opening 250 may correspond to the plurality of first pads 200 and an area surrounding the first pads 200.

The first layer 307 of the protrusion 300 may be integrally provided as a single body with the pixel-defining layer 106. In other words, the first layer 307 having the same layered structure as the pixel-defining layer 106 may be formed together with the pixel-defining layer 106 when the pixel-defining layer 106 is formed, and the first layer 307 may be formed to be connected to the pixel-defining layer 106 without separation so as to be integrally formed as a single body with the pixel-defining layer 106. In this case, the first openings 150 and the second opening 250 of the pixel-defining layer 106 may be simultaneously formed through the same patterning process.

Figure 6:
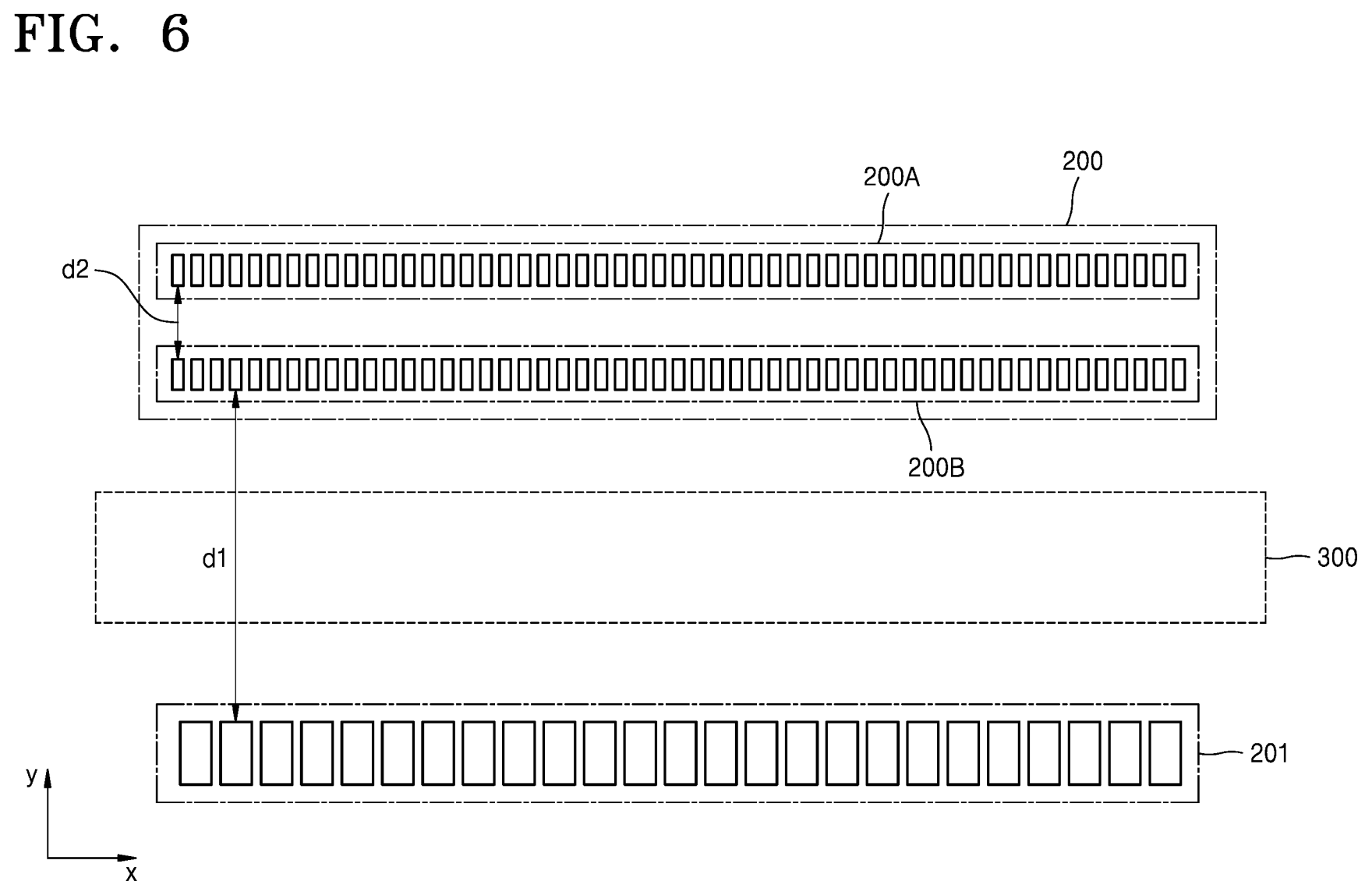

FIG. 6 is a plan view schematically illustrating a plurality of pads of the display device according to an embodiment.

As shown in FIG. 6, the display device according to the present embodiment may include a plurality of second pads 201 in addition to the plurality of first pads 200. The plurality of second pads 201 may be disposed on the substrate 100 and located in the peripheral area PA of the display device. The plurality of second pads 201 may be located on a more outer portion of the substrate 100 than the plurality of first pads 200 with respect to a center of a display area of the display device. The protrusion 300 may be located between the plurality of first pads 200 and the plurality of second pads 201.

As shown in FIG. 6, the plurality of first pads 200 may include a plurality of $1^{st}$-$1^{st}$ pads 200A arranged in a second direction (e.g., x direction) crossing a first direction (e.g., y direction), where the first direction is a direction from the plurality of first pads 200 to the plurality of second pads 201, and a plurality of $1^{st}$-$2^{nd}$ pads 200B is located apart in the first direction (e.g., y direction) from the $1^{st}$-$1^{st}$ pads 200A and arranged in the second direction (e.g., x direction). The first direction is a direction toward the plurality of second pads 201 from the plurality of first pads 200, and the second direction is a direction crossing the first direction.

A distance d2 between the plurality of $1^{st}$-$1^{st}$ pads 200A and the plurality of $1^{st}$-$2^{nd}$ pads 200B in the first direction may be less than a distance d1 between the plurality of $1^{st}$-$2^{nd}$ pads 200B and the plurality of second pads 201.

Figure 7:
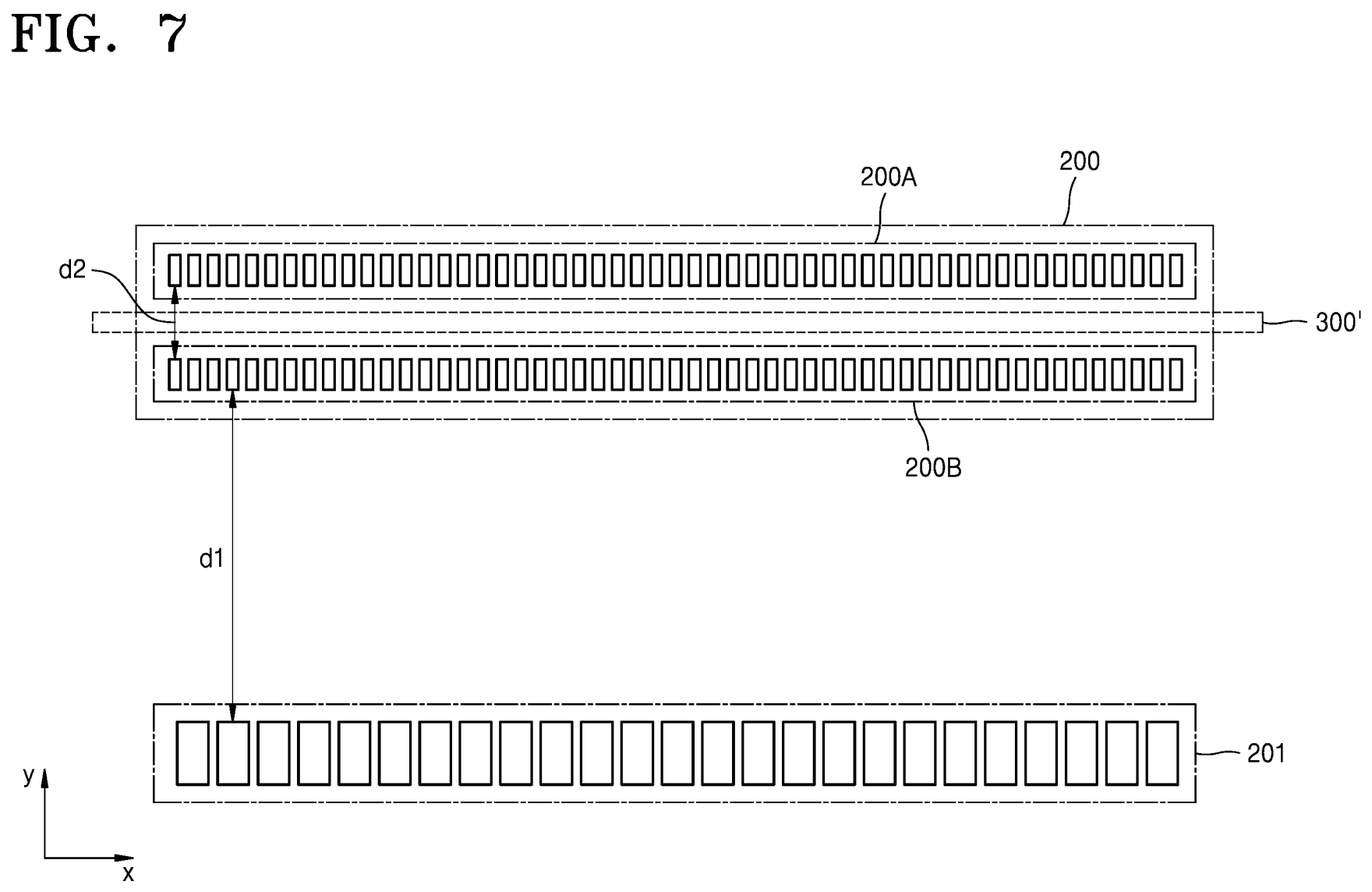

FIG. 7 is a plan view schematically illustrating a plurality of pads of the display device according to another embodiment.

As shown in FIG. 7, the display device according to the present embodiment may include the plurality of first pads 200 and the plurality of second pads 201. Descriptions of the plurality of first pads 200 and the plurality of second pads 201 are same as, or correspond to, the descriptions above, and thus are omitted.

The display device according to the present embodiment may include a second protrusion 300' between the $1^{st}$-$1^{st}$ pads 200A and the $1^{st}$-$2^{nd}$ pads 200B. The second protrusion 300' may be elongated in the second direction between the 1st-1st pads 200A and the $1^{st}$-$2^{nd}$ pads 200B. In this case, the first layer 307 included in the second protrusion 300' may be integrally provided as a single body with the pixel-defining layer 106, as described with reference to FIG. 4.

The second protrusion 300' may be located between the $1^{st}$-$1^{st}$ pads 200A and the $1^{st}$-$2^{nd}$ pads 200B to protect the $1^{st}$-$1^{st}$ pads 200A from the frame 402 even when the frame 402 of the mask-frame assembly 400 does not reach locations of the plurality of second pads 201 of FIG. 6.

A width in the second direction of the second protrusion 300' located between the plurality of $1^{st}$-$1^{st}$ pads 200A and the plurality of $1^{st}$-$2^{nd}$ pads 200B may be less than a width in the second direction of the protrusion 300 located between the plurality of first pads 200 and the plurality of second pads 201.

Figure 8:
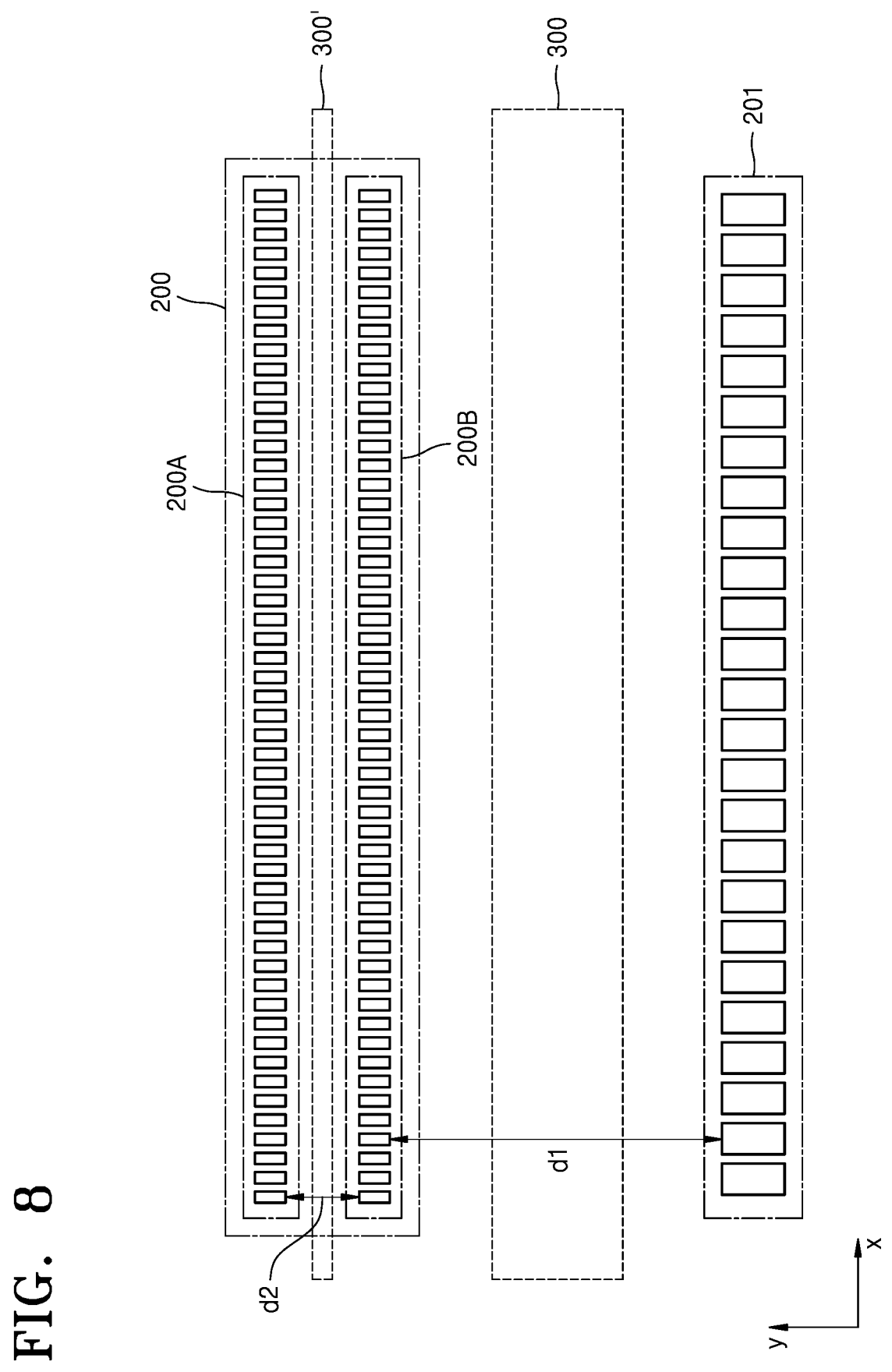

FIG. 8 is a plan view schematically illustrating a plurality of pads of the display device according to still another embodiment.

As shown in FIG. 8, the display device according to the present embodiment may include the plurality of first pads 200, the plurality of second pads 201, the $1^{st}$-$1^{st}$ pads 200A, and the $1^{st}$-$2^{nd}$ pads 200B. In addition, the display device according to the present embodiment may include the protrusion 300 and the second protrusion 300', where the protrusion 300 is located between the plurality of first pads 200 and the plurality of second pads 201, and the second protrusion 300' is located between the $1^{st}$-$1^{st}$ pads 200A and the $1^{st}$-$2^{nd}$ pads 200B. Descriptions of the plurality of first pads 200, the plurality of second pads 201, the $1^{st}$-$1^{st}$ pads 200A, and the $1^{st}$-$2^{nd}$ pads 200B are same as, or correspond to, those described above, and thus are omitted.

Accordingly, because the protrusion 300 and the second protrusion 300' are disposed on the substrate 100, both the plurality of first pads 200 and the plurality of second pads 201 may be protected from the mask-frame assembly 400. In addition, when the display device includes both the protrusion 300 and the second protrusion 300', the plurality of pads may be more safely protected than when the display device includes only one protrusion 300.

Figure 9:
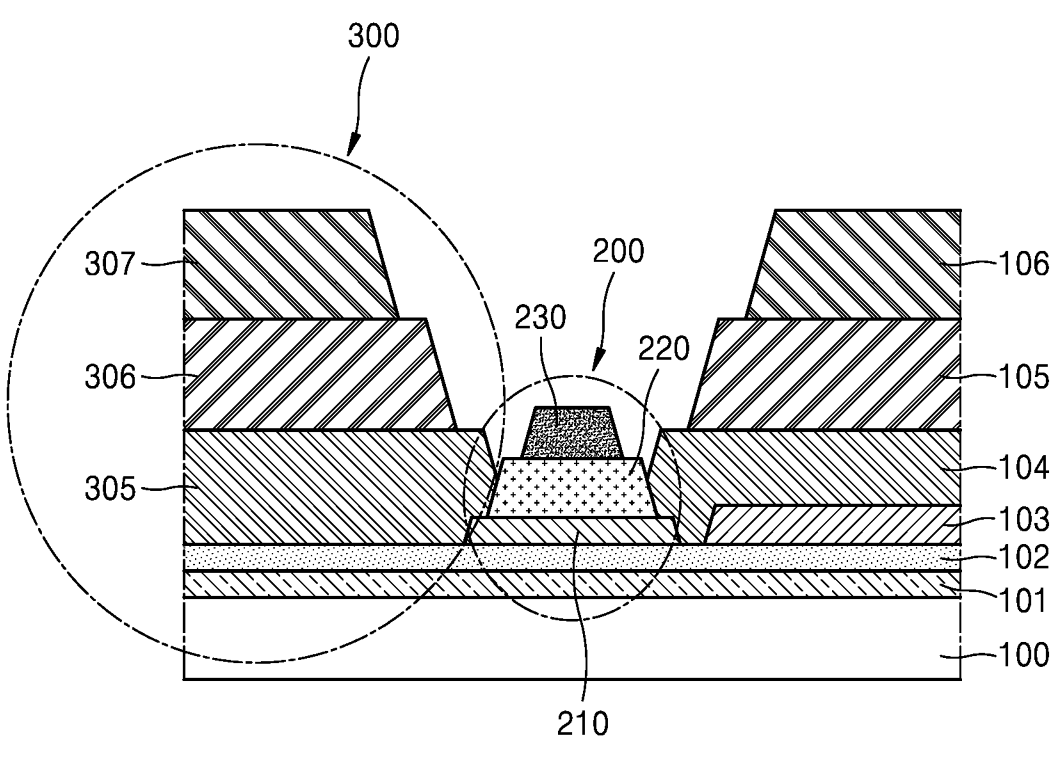
FIG. 9 is a schematic cross-sectional view of part of the display device according to an embodiment.

FIG. 9 is a schematic cross-sectional view of part of the display device according to an embodiment.

As shown in FIG. 9, at least one of layers included in the second layers 305 and 306 of the protrusion 300 may cover part of at least one of the plurality of first pads 200. In other words, the second layers 305 and 306 of the protrusion 300 may include the first sub-layer 305 and the second sub-layer 306, and at least one of the first sub-layer 305 and the second sub-layer 306 may cover part of the at least one of the plurality of first pads 200. In addition, at least one of the first insulating layer 104 and the second insulating layer 105 may cover another part of the at least one of the plurality of first pads 200.

In the embodiment shown in FIG. 9, the first sub-layer 305 may cover part of at least one of the plurality of first pads 200, and the second sub-layer 306 may be apart from the plurality of first pads 200 by not being in contact with the plurality of first pads 200. In other words, unlike the first sub-layer 305, the second sub-layer 306 may not cover part of the plurality of first pads 200.

The first insulating layer 104 may cover another part of the at least one of the plurality of first pads 200, and the second insulating layer 105 may be apart from the plurality of first pads 200 by not being in contact with the plurality of first pads 200.

The first sub-layer 305 may cover part of the upper surface of the first sub-pad 210 of the plurality of first pads 200 and at least part of a sidewall of the second sub-pad 220. In addition, the first insulating layer 104 may cover another part of the upper surface of the first sub-pad 210 and at least part of the other sidewall of the second sub-pad 220.

In FIG. 6, the plurality of first pads 200 are described for convenience of explanation. However, the example shown in FIG. 9 is equally applicable to the $1^{st}$-$1^{st}$ pads 200A, the $1^{st}$-$2^{nd}$ pads 200B, and the plurality of second pads 201.

Figure 10:
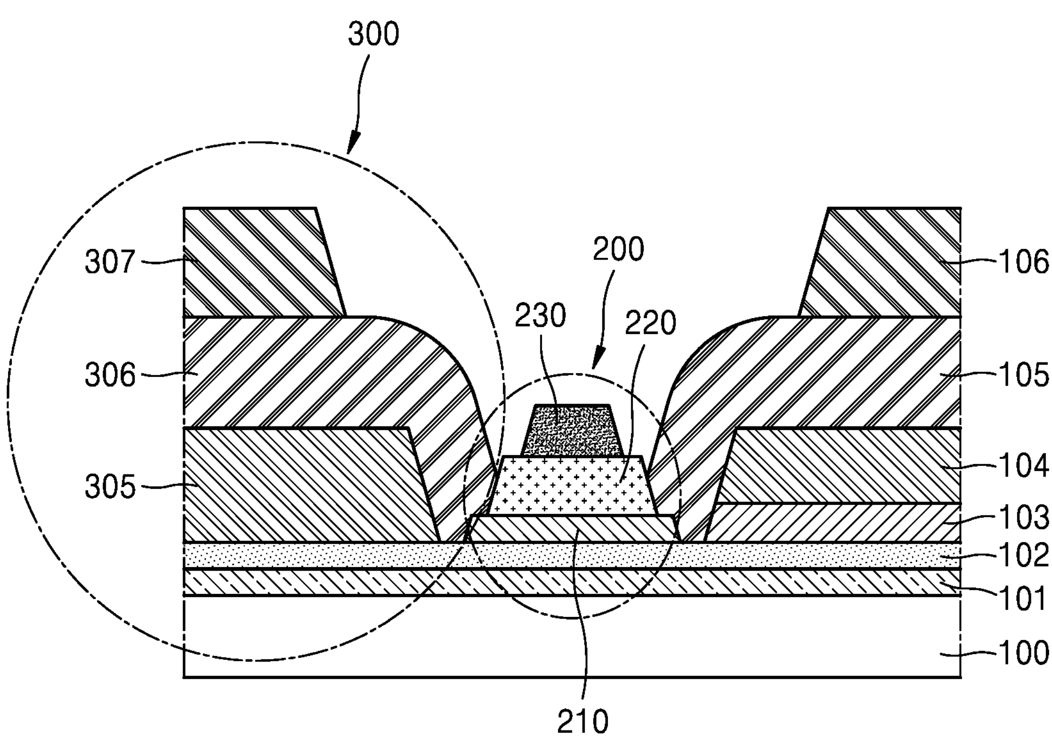
FIG. 10 is a schematic cross-sectional view of part of the display device according to another embodiment.

FIG. 10 is a schematic cross-sectional view of part of the display device according to another embodiment.

As shown in FIG. 10, the first sub-layer 305 may be apart from the plurality of first pads 200 by not being in contact with the plurality of first pads 200, and the second sub-layer 306 may cover part of at least one of the plurality of first pads 200. In this case, the second sub-layer 306 may also be arranged in a space between the first sub-layer 305 and the plurality of first pads 200. In other words, the second sub-layer 306 may fill the space between the first sub-layer 305 and the plurality of first pads 200.

The first sub-layer 305 may be apart from the plurality of first pads 200 by not being in contact with the plurality of first pads 200, and the second sub-layer 306 may cover part of the upper surface of the first sub-pad 210 and at least part of a sidewall of the second sub-pad 220. In addition, the first insulating layer 104 may be apart from the plurality of first pads 200 by not being in contact with the plurality of first pads 200, and the second insulating layer 105 may cover another part of the upper surface of the first sub-pad 210 and at least part of the other sidewall of the second sub-pad 220.

In FIG. 10, the plurality of first pads 200 are described for convenience of explanation. However, the example of FIG. 10 is equally applicable to the $1^{st}$-$1^{st}$ pads 200A, the $1^{st}$-$2^{nd}$ pads 200B, and the plurality of second pads 201.

Figure 11:
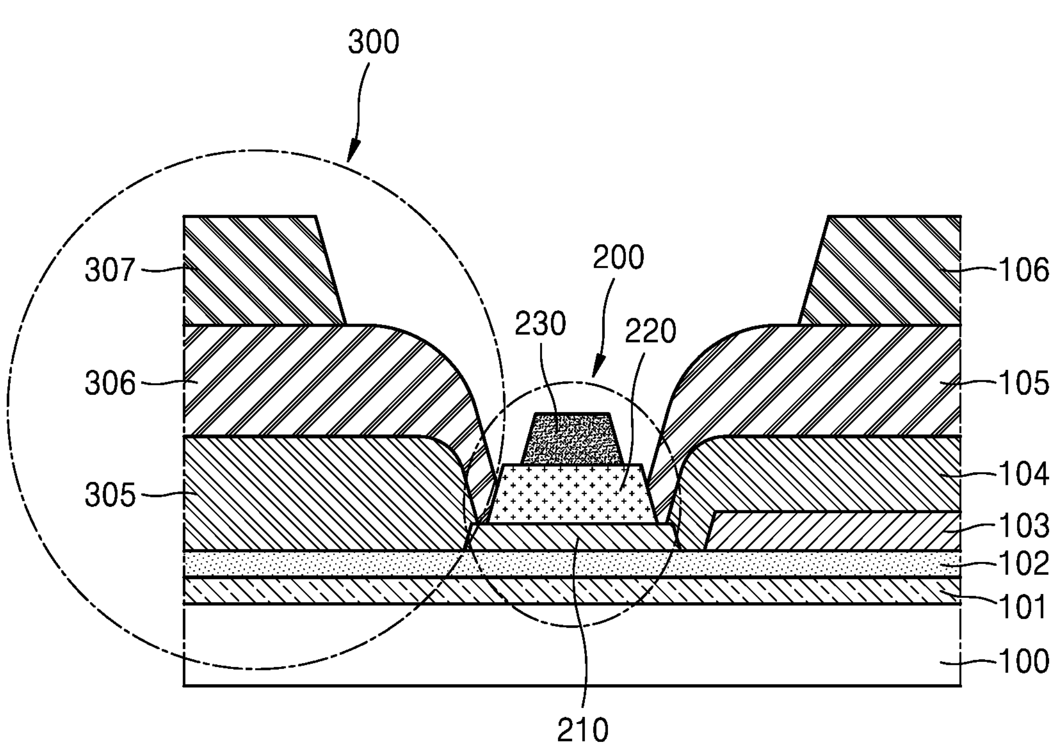
FIG. 11 is a schematic cross-sectional view of part of the display device according to still another embodiment.

FIG. 11 is a schematic cross-sectional view of part of the display device according to still another embodiment.

As shown in FIG. 11, the first sub-layer 305 may cover part of at least one of the plurality of first pads 200, and the second sub-layer 306 may cover the first sub-layer 305 and part of the plurality of first pads 200.

The first insulating layer 104 may cover part of at least one of the plurality of first pads 200, and the second insulating layer 105 may cover the first insulating layer 104 and another part of at least one of the plurality of first pads 200.

In other words, the first sub-layer 305 may cover part of the upper surface of the first sub-pad 210. In addition, the second sub-layer 306 may cover the first sub-layer 305 and at least part of a sidewall of the second sub-pad 220.

The first insulating layer 104 may cover another part of the upper surface of the first sub-pad 210 of the plurality of first pads 200. In addition, the second insulating layer 105 may cover the first insulating layer 104 and at least part of the other sidewall of the second sub-pad 220.

In FIG. 11, the plurality of first pads 200 area described for convenience of explanation. However, the example of FIG. 11 is equally applicable to the $1^{st}$-$1^{st}$ pads 200A, the $1^{st}$-$2^{nd}$ pads 200B, and the plurality of second pads 201.

According to an embodiment configured as described above, a display device in which a plurality of pads may be protected from a mask frame used in a manufacturing process of the display device may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:

a substrate comprising a display area and a peripheral area outside the display area;

a pixel electrode disposed on the substrate and located in the display area;

a plurality of conductive layers between the substrate and the pixel electrode;

a pixel-defining layer covering an edge of the pixel electrode;

a plurality of first pads disposed on the substrate and located in the peripheral area; and a protrusion, which is disposed on the substrate and located in the peripheral area, has a height, from an upper surface of the substrate, that is greater than a height from the upper surface of the substrate to an upper surface of the plurality of first pads, and comprises a first layer having a same layered structure as the pixel-defining layer, wherein the pixel-defining layer has a height from the upper surface of the substrate that corresponds to the height of the protrusion from the upper surface of the substrate, wherein the plurality of first pads comprises sub-pads corresponding to the plurality of conductive layers.

2. The display device of claim 1, further comprising a plurality of insulating layers between the substrate and the pixel electrode, wherein the protrusion further comprises second layers located between the substrate and the first layer and corresponding to the plurality of insulating layers.

3. The display device of claim 2, wherein the second layers comprise:

a first sub-layer located between the substrate and the first layer and corresponding to a first insulating layer of the plurality of insulating layers; and a second sub-layer located between the first sub-layer and the first layer and corresponding to a second insulating layer of the plurality of insulating layers, wherein the plurality of insulating layers includes the first insulating layer and the second insulating layer.

4. The display device of claim 1, wherein the plurality of first pads further comprises an additional pad located on the sub-pads and comprising a same material as the pixel electrode.

5. The display device of claim 1, wherein the first layer is integrally provided as a single body with the pixel-defining layer.

6. The display device of claim 1, further comprising a plurality of second pads which is disposed on the substrate and located in the peripheral area, and is located on a more outer portion of the substrate than the plurality of first pads with respect to a center of the display area.

7. The display device of claim 6, wherein the plurality of first pads is disposed opposing the plurality of second pads with respect to the protrusion.

8. The display device of claim 6, wherein the plurality of first pads is disposed in a first direction from the plurality of second pads, wherein the plurality of first pads comprises:

a plurality of $1^{st}$-$1^{st}$ pads arranged in a second direction crossing the first direction; and a plurality of $1^{st}$-2nd pads located spaced apart in the first direction from the $1^{st}$-$1^{st}$ pads and arranged in the second direction.

9. The display device of claim 8, wherein a distance between the plurality of $1^{st}$-$1^{st}$ pads and the plurality of $1^{st}$-$2^{nd}$ pads in the first direction is less than a distance between the plurality of $1^{st}$-$2^{nd}$ pads and the plurality of second pads in the first direction.

10. A display device comprising:

a substrate comprising a display area and a peripheral area outside the display area;

a pixel electrode disposed on the substrate and located in the display area;

a pixel-defining layer covering an edge of the pixel electrode;

a plurality of first pads disposed on the substrate and located in the peripheral area;

a plurality of second pads which is disposed on the substrate and located in the peripheral area, and is located on a more outer portion of the substrate than the plurality of first pads with respect to a center of the display area; and a protrusion, which is disposed on the substrate and located in the peripheral area, has a height, from an upper surface of the substrate, that is greater than a height from the upper surface of the substrate to an upper surface of the plurality of first pads, and comprises a first layer having a same layered structure as the pixel-defining layer, wherein the pixel-defining layer has a height from the upper surface of the substrate that corresponds to the height of the protrusion from the upper surface of the substrate, wherein the plurality of first pads is disposed in a first direction from the plurality of second pads, wherein the plurality of first pads comprises:

a plurality of $1^{st}$-$1^{st}$ pads arranged in a second direction crossing the first direction; and a plurality of $1^{st}$-$2^{nd}$ pads located spaced apart in the first direction from the 1st-1st pads and arranged in the second direction, wherein the $1^{st}$-$1^{st}$ pads are disposed opposing the $1^{st}$-$2^{nd}$ pads with respect to the protrusion.

11. The display device of claim 10, wherein the first layer is integrally provided as a single body with the pixel-defining layer.

12. A display device comprising:

a substrate comprising a display area and a peripheral area outside the display area;

a pixel electrode disposed on the substrate and located in the display area;

a plurality of insulating layers between the substrate and the pixel electrode;

a pixel-defining layer covering an edge of the pixel electrode;

a plurality of first pads disposed on the substrate and located in the peripheral area; and a protrusion, which is disposed on the substrate and located in the peripheral area, has a height, from an upper surface of the substrate, that is greater than a height from the upper surface of the substrate to an upper surface of the plurality of first pads, and comprises a first layer having a same layered structure as the pixel-defining layer, wherein the pixel-defining layer has a height from the upper surface of the substrate that corresponds to the height of the protrusion from the upper surface of the substrate, wherein the protrusion further comprises second layers located between the substrate and the first layer and corresponding to the plurality of insulating layers, wherein the second layers comprise:

a first sub-layer located between the substrate and the first layer and corresponding to a first insulating layer of the plurality of insulating layers; and a second sub-layer located between the first sub-layer and the first layer and corresponding to a second insulating layer of the plurality of insulating layers, and wherein the plurality of insulating layers includes the first insulating layer and the second insulating layer, and wherein at least one of the first sub-layer and the second sub-layer covers part of at least one of the plurality of first pads.

13. The display device of claim 12, wherein the at least one of the plurality of first pads comprises a first sub-pad located on the substrate, a second sub-pad located on the first sub-pad, and a third sub-pad located on the second sub-pad, and the first sub-layer covers part of an upper surface of the first sub-pad, and the second sub-layer is spaced apart from the plurality of first pads.

14. The display device of claim 13, wherein the first insulating layer covers another part of the upper surface of the first sub-pad, and the second insulating layer is apart from the plurality of first pads.

15. The display device of claim 12, wherein the at least one of the plurality of first pads comprises a first sub-pad located on the substrate, a second sub-pad located on the first sub-pad, and a third sub-pad located on the second sub-pad, and the first sub-layer is apart from the plurality of first pads, and the second sub-layer covers the first sub-layer and at least part of one sidewall of the second sub-pad.

16. The display device of claim 15, wherein the first insulating layer is apart from the plurality of first pads, and the second insulating layer covers the first insulating layer and at least part of another sidewall of the second sub-pad.

17. The display device of claim 12, wherein the at least one of the plurality of first pads comprises a first sub-pad located on the substrate, a second sub-pad located on the first sub-pad, and a third sub-pad located on the second sub-pad, and the first sub-layer covers part of an upper surface of the first sub-pad, and the second sub-layer covers the first sub-layer and at least part of a sidewall of the second sub-pad.

18. The display device of claim 17, wherein the first insulating layer covers another part of the upper surface of the first sub-pad, and the second insulating layer covers the first insulating layer and at least part of another sidewall of the second sub-pad.

19. The display device of claim 1, wherein each of the plurality of first pads comprises a first sub-pad located on the substrate, a second sub-pad located on the first sub-pad, and a third sub-pad located on the wherein the display device further comprises a first insulating layer, a second insulating layer, a first conductive layer disposed within the first insulating layer, and a second conductive layer disposed atop the first insulating layer and within the second insulating layer, wherein the protrusion comprises a first sub-layer located between the substrate and the first layer and corresponding to the first insulating layer, and a second sub-layer located between the first sub-layer and the first layer and corresponding to the second insulating layer, and wherein the second sub-pad has a layered structure corresponding to the first conductive layer, and the third sub-pad has a layered structure corresponding to the second conductive layer.

* * * * *